(12) United States Patent
Wei et al.

(10) Patent No.: US 12,346,148 B2
(45) Date of Patent: *Jul. 1, 2025

(54) DIGITAL CLOCK SIGNAL GENERATOR, CHIP, AND METHOD FOR GENERATING SPREAD-SPECTRUM SYNCHRONOUS CLOCK SIGNALS

(71) Applicants: Beijing BOE Technology Development Co., Ltd., Beijing (CN); BOE Technology Group Co., Ltd., Beijing (CN)

(72) Inventors: Xiangye Wei, Beijing (CN); Liming Xiu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 105 days.

This patent is subject to a terminal disclaimer.

(21) Appl. No.: 18/459,053

(22) Filed: Aug. 31, 2023

(65) Prior Publication Data

US 2023/0409074 A1  Dec. 21, 2023

Related U.S. Application Data

(63) Continuation-in-part of application No. 16/975,258, filed as application No. PCT/CN2019/110152 on Oct. 9, 2019, now Pat. No. 11,848,679.

(51) Int. Cl.
*H03D 3/24* (2006.01)
*G06F 1/08* (2006.01)

(52) U.S. Cl.
CPC ..................................... *G06F 1/08* (2013.01)

(58) Field of Classification Search
CPC .......... H04L 7/033; H04L 7/04; H04L 7/0008; H03L 7/0891; H03L 7/091; H03L 7/08;
(Continued)

(56) References Cited

U.S. PATENT DOCUMENTS 6,622,010 B1 * 9/2003 Ichimaru ............... H03L 7/0891
331/1 R
11,848,679 B2 * 12/2023 Wei ........................ H03L 7/089
(Continued)

FOREIGN PATENT DOCUMENTS

CN  106708166 A  5/2017
CN  107896107 A  4/2018
(Continued)

OTHER PUBLICATIONS

The Extended European Search Report in the European Patent Application No. 19948613.5, dated Sep. 15, 2022.
(Continued)

*Primary Examiner* — Khai Tran
(74) *Attorney, Agent, or Firm* — Intellectual Valley Law, P.C.

(57) ABSTRACT

A method for generating spread-spectrum synchronous clock signals includes comparing an input signal of a first frequency with a feedback signal of a second frequency in a loop of feedback; generating a first control signal and a second control signal; determining an integer part I of a control word F to track the first frequency; registering n levels for the first control signal and the second control signal to introduce n phase delays for randomly changing a fraction part r (0<r<1) of the control word F to provide a broadened boundary in frequency spectrum; and generating a synthesized periodic signal with the second frequency based on a base time unit Δ, the first frequency, and the control word F, the synthesized periodic signal being fed (Continued)

back as the feedback signal in the loop of feedback and outputted with the second frequency being locked within the broadened boundary.

19 Claims, 7 Drawing Sheets

(58) Field of Classification Search
CPC ... H03L 7/0991; H03L 7/089; H03L 2207/50; G06F 1/12; G06F 1/08
USPC ............... 375/376, 375; 455/103, 127, 307; 327/156; 331/177 R
See application file for complete search history.

(56) References Cited

U.S. PATENT DOCUMENTS

| | | |
|---|---|---|
| 2005/0162552 A1 | 7/2005 | Xiu et al. |
| 2009/0302951 A1* | 12/2009 | Ballantyne .............. H03L 7/099 331/18 |
| 2011/0109355 A1* | 5/2011 | Sakaguchi ................ H03L 7/23 327/157 |
| 2012/0161835 A1 | 6/2012 | David et al. |
| 2014/0093015 A1 | 4/2014 | Xiu |
| 2014/0185736 A1 | 7/2014 | Chandrashekar et al. |
| 2016/0006441 A1* | 1/2016 | van der Wagt .......... H03K 5/14 327/158 |
| 2018/0138915 A1 | 5/2018 | Jenkins et al. |
| 2018/0196460 A1 | 7/2018 | Xiu |
| 2019/0123749 A1 | 4/2019 | Xiu |
| 2021/0159893 A1 | 5/2021 | Wei et al. |

FOREIGN PATENT DOCUMENTS

| | | |
|---|---|---|
| CN | 110199477 A | 9/2019 |
| JP | 2011107750 A | 6/2011 |
| JP | 2011524149 A | 8/2011 |

OTHER PUBLICATIONS

International Search Report & Written Opinion mailed Jul. 8, 2020, regarding PCT/CN2019/110152.
Restriction Requirement in the U.S. Appl. No. 16/975,258, dated May 15, 2023.
Response to Restriction Requirement in the U.S. Appl. No. 16/975,258, dated Jul. 8, 2023.
Notice of Allowance in the U.S. Appl. No. 16/975,258, dated Aug. 9, 2023.
Decision to Grant a Patent in the Japanese Patent Application No. 2021567872, dated Apr. 8, 2024. English translation attached.

* cited by examiner

Related Art

DIGITAL CLOCK SIGNAL GENERATOR, CHIP, AND METHOD FOR GENERATING SPREAD-SPECTRUM SYNCHRONOUS CLOCK SIGNALS

CROSS-REFERENCE TO RELATED APPLICATION

This application is a continuation-in-part of U.S. application Ser. No. 16/975,258, filed Oct. 9, 2019, which is a national stage application under 35 U.S.C. § 371 of International Application No. PCT/CN2019/110152, filed Oct. 9, 2019. Each of the forgoing applications is herein incorporated by reference in its entirety for all purposes.

TECHNICAL FIELD

The present invention relates to data transmission technology, more particularly, to a digital clock signal generator, chip, and method for generating spread-spectrum synchronous clock signals for data transmission.

BACKGROUND

Electromagnetic interference (EMI) becomes more and more a big issue for many digital electronic products. One major source of the EMI is a clock circuit in IC chip which serves a driving heart for the whole chip operation. To drive the timing sequence circuit, the clock circuit needs strong driving power, releasing strong radiated energy externally. Spread-spectrum techniques using a signal with a wider bandwidth may be employed for increasing resistance to natural interference, noise and jamming, to prevent detection, and to limit power flux density. But for big data applications, data transmissions always need strong clock signals and lots of considerations on data alignment, and traditional clock signals with spread spectrum are difficult to be implemented for data transmission as phases of clock timings become uncontrollable. As shown in FIG. 1, upper part of it shows a clock signal that is originally used to drive a data transmitter and lower part of it shows the clock signal being spread in phases. When the clock signal with spread phases is used to drive a data receiver, this spread-spectrum clock signal cannot ensure a corresponding establishing time and maintaining time for every data at the data receiver. Possibly at some moment, some data may be read multiple times or lost, making this system data transmission totally unsecure. Improved spread-spectrum clock signal generator is desired.

SUMMARY

In one aspect, the present disclosure provides a method for generating spread-spectrum synchronous clock signals comprising comparing an input signal of a first frequency with a feedback signal of a second frequency in a loop of feedback; generating a first control signal and a second control signal; determining an integer part I of a control word F to track the first frequency; registering n levels for the first control signal and the second control signal to introduce n phase delays for randomly changing a fraction part r ($0<r<1$) of the control word F to provide a broadened boundary in frequency spectrum; and generating a synthesized periodic signal with the second frequency based on a base time unit $\Delta$, the first frequency, and the control word F, the synthesized periodic signal being fed back as the feedback signal in the loop of feedback and outputted with the second frequency being locked within the broadened boundary of the first frequency.

Optionally, the method further comprises generating K pulses of the first frequency with equally spaced phase shift of $\Delta$, so that under control of the control word F ($2 \le F \le 2K$) the synthesized periodic signal is selected from one of the K pulses with an average period $T = F \cdot \Delta$ and the second frequency, the second frequency being a time-average frequency equal to K/F multiplying the first frequency.

Optionally, the method further comprises detecting a relationship between the first frequency and the second frequency; and generating a first control signal and a second control signal alternately in a first timeframe and a second timeframe one after another based on the relationship between the first frequency and the second frequency.

Optionally, the method further comprises determine whether the first frequency is greater or smaller than the second frequency; and outputting either the first control signal in the first timeframe based on determination that the first frequency is greater than the second frequency or the second control signal in the second timeframe based on determination that the first frequency is smaller than the second frequency.

Optionally, the first control signal is to control reducing the control word F in the first timeframe and the second control signal is to control increasing the control word F in the second timeframe, so that the control word F is switched between I and I+1 as the loop of feedback reaches a dynamic equilibrium with one first timeframe and one second timeframe appearing alternately one after another.

Optionally, the dynamic equilibrium comprises one first timeframe and one second timeframe appearing alternately one after another on average, based on a number $N_A$ of output pulses having a first period $T_A = I \cdot \Delta$ in the first timeframe and a number $N_B$ of output pulses having a second period $T_B = (I+1) \cdot \Delta$ in the second timeframe, yielding a fraction number r to be a ratio of $N_B$ over a sum of $N_A$ and $N_B$.

Optionally, the method further comprises receiving the first control signal to generate total n levels of first register-delayed control signals, or receiving the second control signal to generate total n levels of second register-delayed control signals; randomly select a value of the fraction number r; selecting any path associated with the n levels of the first register-delayed control signals and the n levels of the second register-delayed control signals; and receiving the value of the fraction number r to determine the control word F.

Optionally, the method further comprises forming a first group of D-type flip-flops having n stages connected in series to receive the first control signal at the first one of the n stages of the first group of D-type flip-flops and to receive the feedback signal at each of the n stages of the first group of D-type flip-flops; generating n levels of first register-delayed control signals; forming a second group of D-type flip-flops having n stages connected in series to receive the second control signal at the first one of the n stages of the second group of D-type flip-flops and to receive the feedback signal at each of the n stages of the second group of D-type flip-flops; and generating n levels of second register-delayed control signals.

Optionally, the method further comprises introducing n choices of $N_A$ and n choices of $N_B$, and a randomly selected $r = N_B/(N_A + N_B)$ to provide the broadened boundary defined by a maximum value of the feedback signal leading the input signal in phase as $N_A \cdot (T-T_A)$ and a maximum value of the feedback signal lagging behind the input signal in phase as $N_B \cdot (T_B-T)$.

Optionally, the method further comprises using a first K-to-1 multiplexer coupled to an accumulation-register controlled by the control word F via an accumulator in a first path to input K pulses of the first frequency with equally spaced phase delay $\Delta$, generating a low level of the synthesized periodic signal, using a second K-to-1 multiplexer coupled to an adder-register controlled by the half control word F/2 via an adder in a second path to input the K pulses of the first frequency with equally spaced phase delay $\Delta$, generating a high level of the synthesized periodic signal, using a 2-to-1 multiplexer to interlock the first path and the second path to output either the high level or the low level of the synthesized periodic signal.

Optionally, the method further comprises transmitting the synthesized periodic signal as a spread-spectrum clock signal as the second frequency is substantially synchronous to the first frequency under a condition that a data-reception establishing time is less than half the period T minus a maximum value of the synthesized periodic signal leading the input signal in phase and a data-reception maintaining time is less than half the period T minus a maximum value of the synthesized periodic signal lagging behind the input signal in phase.

Optionally, the method further comprises toggling transition of a upper path and a lower path.

Optionally, the method further comprises generating multiple pulses of the first frequency with equally spaced phase delay $\Delta$; obtaining a synthesized periodic signal with a time-average frequency from one of the multiple pulses controlled by a control word F, the synthesized periodic signal being used as a feedback signal; comparing the input signal of the first frequency with the feedback signal of a second frequency in a loop of feedback; and generating a first control signal and a second control signal alternately in a first timeframe and a second timeframe one after another based on relationship between the first frequency and the second frequency.

Optionally, the method further comprises updating an integer part I of the control word F based on the first control signal or the second control signal to allow the second frequency to track the first frequency.

Optionally, updating an integer part I of the control word F comprises reducing the integer part I triggered by the first control signal in the first timeframe and increasing the integer part I triggered by the second control signal in the second timeframe.

Optionally, the method further comprises generating multiple delays in respective first control signal and the second control signal.

Optionally, the method further comprises selecting a fraction number r of the control word F randomly based on the multiple delays to provide a broadened phase boundary of a spread spectrum.

Optionally, selecting a fraction number r of the control word F randomly based on the multiple delays comprises selecting randomly one of first register-delayed control signals using a pseudo random binary sequence (PRBS) generator to drive a controller to control a number of output pulses with a first period in the first timeframe, and selecting randomly one of second register-delayed control signals using a pseudo random binary sequence (PRBS) generator to drive the controller to control a number of output pulses with a second period in the second timeframe.

Optionally, the method further comprises outputting a clock signal based on the synthesized periodic signal with the time-average frequency being locked by the control word F within I and I+1 at a dynamic equilibrium in the loop of feedback.

In another aspect, the present disclosure provides a circuit for generating spread-spectrum synchronous clock signal in a frequency locked loop. The circuit includes a frequency detector including a fraction controller configured to compare an input signal of a first frequency with a feedback signal of a second frequency in a loop of feedback to generate a first control signal and a second control signal alternately for determining an integer part I of a control word F to track the first frequency. The frequency detector also includes a phase-shift controller configured to register n levels for the first control signal and the second control signal to introduce n phase delays for randomly changing a fraction part r ($0<r<1$) of the control word F to provide a broadened boundary in frequency spectrum. The circuit further includes a digitally controlled oscillator configured to generate a synthesized periodic signal with the second frequency based on a base time unit $\Delta$, the first frequency, and the control word F. The synthesized periodic signal is fed back as the feedback signal in the loop of feedback and outputted with the second frequency being locked within the broadened boundary of the first frequency.

Optionally, the digitally controlled oscillator is configured to generate K pulses of the first frequency with equally spaced phase shift of $\Delta$, so that under control of the control word F ($2 \leq F \leq 2K$) the synthesized periodic signal is selected from one of the K pulses with an average period $T=F \cdot \Delta$ and the second frequency being a time-average frequency equal to K/F multiplying the first frequency.

Optionally, the fraction controller includes a first input port receiving the input signal, a second input port receiving the feedback signal, a trigger sub-circuit coupled to the first input port and the second input port and configured to detect a relationship between the first frequency and the second frequency, a combined logic sub-circuit coupled to the trigger sub-circuit to generate the first control signal to a first control port in a first timeframe and the second control signal to a second control port in a second timeframe. The first timeframe and second timeframe alternately appear one after other.

Optionally, the trigger sub-circuit includes four D-type flip-flops coupled to the first input port via a power-divider and to the second input port partially via an inverter. The four D-type flip-flops are configured to determine the first frequency being greater or smaller than the second frequency. The combined logic sub-circuit includes two XOR gates, two inverters, and two AND gates configured to output either the first control signal to the first control port in the first timeframe based on determination that the first frequency is greater than the second frequency or the second control signal to the second control port in the second timeframe based on determination that the first frequency is smaller than the second frequency.

Optionally, the first control signal is to control reducing the control word F in the first timeframe and the second control signal is to control increasing the control word F in the second timeframe, so that the control word F is switched between I and I+1 as the loop of feedback reaches a dynamic equilibrium with one first timeframe and one second timeframe appearing alternately one after another.

Optionally, the dynamic equilibrium includes one first timeframe and one second timeframe appearing alternately one after another on average, based on a number $N_A$ of output pulses having a first period $T_A=I\cdot\Delta$ in the first timeframe and a number $N_B$ of output pulses having a second period $T_B=(I+1)\cdot\Delta$ in the second timeframe. The dynamic equilibrium yields the fraction number r to be a ratio of $N_B$ over a sum of $N_A$ and $N_B$.

Optionally, the phase-shift controller includes an n-level cache sub-circuit configured to receive the first control signal to generate total n levels of first register-delayed control signals, or receive the second control signal to generate total n levels of second register-delayed control signals. The phase-shift controller also includes a pseudo random binary sequence (PRBS) generator to randomly select a value of the fraction number r. The phase-shift controller further includes a control sub-circuit configured to select any path associated with the n levels of the first register-delayed control signals and the n levels of the second register-delayed control signals and receive the value of the fraction number r to determine the control word F.

Optionally, the n-level cache sub-circuit includes a first group of D-type flip-flops having n stages connected in series configured to receive the first control signal at a first stage of the n stages of the first group of D-type flip-flops and to receive the feedback signal at each of the n stages of the first group of D-type flip-flops, and to generate the n levels of first register-delayed control signals. The n-level cache sub-circuit also includes a second group of D-type flip-flops having n stages connected in series configured to receive the second control signal at the first stage of the n stages of the second group of D-type flip-flops and to receive the feedback signal at each of the n stages of the second group of D-type flip-flops, and to generate the n levels of second register-delayed control signals.

Optionally, the n-level cache sub-circuit introduces n choices of $N_A$ and n choices of $N_B$. A randomly selected $r=N_B/(N_A+N_B)$ provides the broadened boundary defined by a maximum value of the feedback signal leading the input signal in phase as $N_A\cdot(T-T_A)$ and a maximum value of the feedback signal lagging behind the input signal in phase as $N_B\cdot(T_B-T)$.

Optionally, the digitally controlled oscillator includes a voltage-controlled oscillator for generating the K pulses with equally spaced phase, a first K-to-1 multiplexer coupled to an accumulation-register controlled by the control word F via an accumulator to input the K pulses through a lower path for generating a low level of the synthesized periodic signal, a second K-to-1 multiplexer coupled to an adder-register controlled by the half control word F/2 via an adder to input the K pulses through an upper path for generating a high level of the synthesized periodic signal, a 2-to-1 multiplexer to control transition between the upper path and the lower path to output the synthesized periodic signal.

Optionally, the synthesized periodic signal is transmitted as a spread-spectrum clock signal as the second frequency is substantially synchronous to the first frequency under a condition that a data-reception establishing time is less than half the period T minus a maximum value of the synthesized periodic signal leading the input signal in phase and a data-reception maintaining time is less than half the period T minus a maximum value of the synthesized periodic signal lagging behind the input signal in phase.

Optionally, the digitally controlled oscillator further includes a toggle flip-flop coupled to the 2-to-1 multiplexer to toggle the transition of the upper path and the lower path.

In another aspect, the present disclosure provides a chip for functionally generating spread-spectrum synchronous clock signal comprising the circuit described herein and implemented in Field Programmable Gate Arrays (FPGA).

In yet another aspect, the present disclosure provides a chip for functionally generating spread-spectrum synchronous clock signal comprising the circuit described herein and implemented in an application-specific integrated circuit (ASIC).

In still another aspect, the present disclosure provides a method for generating spread-spectrum synchronous clock signals. The method includes a step of providing an input signal of a first frequency. The method also includes a step of generating multiple pulses of the first frequency with equally spaced phase delay $\Delta$. Additionally, the method includes a step of obtaining a synthesized periodic signal with a time-average frequency from one of the multiple pulses controlled by a control word F. The synthesized periodic signal is used as a feedback signal. The method further includes a step of comparing the input signal of the first frequency with the feedback signal of a second frequency in a loop of feedback. Furthermore, the method includes a step of generating a first control signal and a second control signal alternately in a first timeframe and a second timeframe one after another based on relationship between the first frequency and the second frequency. The method further includes a step of updating an integer part I of the control word F based on the first control signal or the second control signal to allow the second frequency to track the first frequency. The method also includes a step of generating multiple delays in respective first control signal and the second control signal. Moreover, the method includes a step of selecting a fraction part r of the control word F randomly based on the multiple delays to provide a broadened phase boundary of a spread spectrum. Further, the method includes a step of outputting a clock signal based on the synthesized periodic signal with the time-average frequency being locked by the control word F within I and I+1 at a dynamic equilibrium in the loop of feedback.

Optionally, the step of obtaining a synthesized periodic signal with a time-average frequency includes a sub-step of using a first K-to-1 multiplexer coupled to an accumulation-register controlled by the control word F via an accumulator in a first path to input K pulses of the first frequency with equally spaced phase delay $\Delta$, a sub-step of generating a low level of the synthesized periodic signal, using a second K-to-1 multiplexer coupled to an adder-register controlled by the half control word F/2 via an adder in a second path to input the K pulses of the first frequency with equally spaced phase delay $\Delta$, a sub-step of generating a high level of the synthesized periodic signal, and a sub-step of using a 2-to-1 multiplexer to interlock the first path and the second path to output either the high level or the low level of the synthesized periodic signal.

Optionally, the step of generating a first control signal and a second control signal includes a sub-step of operating a fraction controller to output the first control signal in a first timeframe based on determination that the first frequency is greater than the second frequency and output the second control signal in a second timeframe based on determination that the first frequency is smaller than the second frequency.

Optionally, the step of updating an integer part I of the control word F includes reducing the integer part I triggered by the first control signal in the first timeframe and increasing the integer part I triggered by the second control signal in the second timeframe.

Optionally, the step of generating multiple delays in respective first control signal and the second control signal includes a sub-step of forming a first group of D-type flip-flops having n stages connected in series to receive the first control signal at the first one of the n stages of the first group of D-type flip-flops and to receive the feedback signal at each of the n stages of the first group of D-type flip-flops, a sub-step of generating n levels of first register-delayed control signals; forming a second group of D-type flip-flops having n stages connected in series to receive the second control signal at the first one of the n stages of the second group of D-type flip-flops and to receive the feedback signal at each of the n stages of the second group of D-type flip-flops, a sub-step of generating n levels of second register-delayed control signals.

Optionally, the step of selecting a fraction part r of the control word F randomly based on the multiple delays includes selecting randomly one of the first register-delayed control signals using a pseudo random binary sequence (PRBS) generator to drive a controller to control a number of output pulses with a first period in the first timeframe, and selecting randomly one of the second register-delayed control signals using a pseudo random binary sequence (PRBS) generator to drive the controller to control a number of output pulses with a second period in the second timeframe.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional spread-spectrum clock signal has uncontrolled phase relationship so that the clock signal cannot properly provide satisfactory data-establishing time and data-maintaining time for driving the receiver. The data transmission system driven by this type of driving clock signals is not reliable for securely transmitting data.

Figure 1:
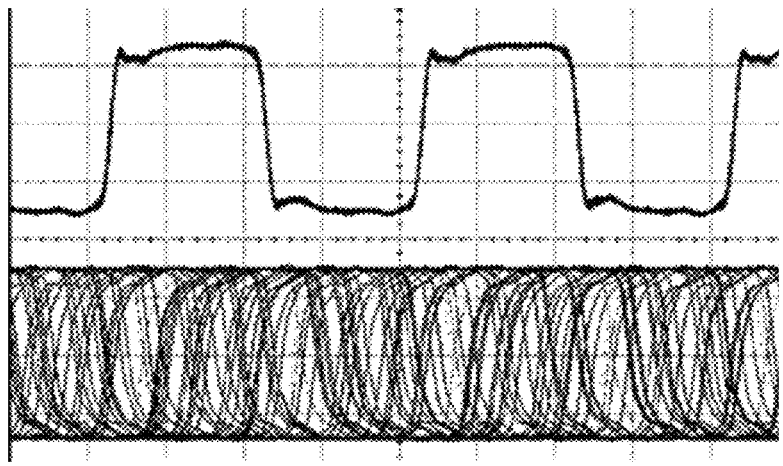
FIG. 1 is an exemplary diagram showing a single frequency clock signal for driving a transmitter and a spread-spectrum clock signal for driving a receiver in conventional manner.
Figure 2:
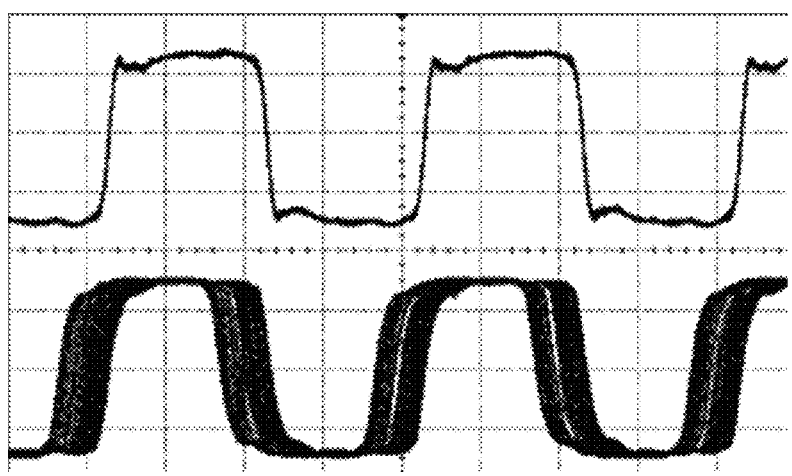
FIG. 2 is an exemplary diagram showing a single frequency clock signal for driving a transmitter and a spread-spectrum synchronous clock signal for driving a receiver according to some embodiments of the present disclosure.

Accordingly, the present disclosure provides, inter alia, a circuit for generating spread-spectrum synchronous clock signal and a method thereof that substantially obviate one or more of the problems due to limitations and disadvantages of the related art. In one aspect, the present disclosure provides a circuit based on frequency locked loop for generating synchronous spread-spectrum clock signal that can keep phases of the spread-spectrum signals within a broadened boundary. FIG. 2 shows an exemplary diagram showing a single frequency clock signal for driving a transmitter and a spread-spectrum synchronous clock signal for driving a receiver according to some embodiments of the present disclosure. As shown in FIG. 2, although an outputted clock signal has multiple phase relationship with original input signal, it will not exceed a preset boundary in the spread spectrum. Therefore, the output signal and the input signal are considered to be substantially synchronous to each other. As long as the data-establishing time and data maintaining time for the receiving data can be provided sufficiently in time under the spread-spectrum synchronous clock signal, the data can be securely transmitted from the transmitter to the receiver.

Figure 3:
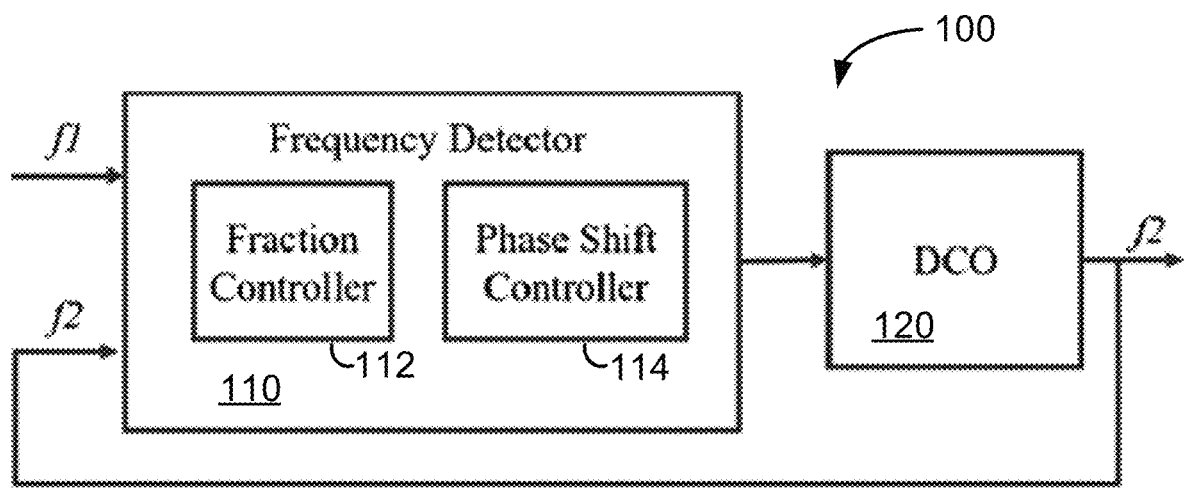
FIG. 3 is a block diagram of a circuit for generating spread-spectrum synchronous clock signal in a frequency locked loop according to an embodiment of the present disclosure.

FIG. 3 is a block diagram of a circuit for generating spread-spectrum synchronous clock signal in a frequency locked loop according to an embodiment of the present disclosure. In the disclosure, the circuit for generating spread-spectrum synchronous clock signal in a frequency locked loop is referred to a spread-spectrum clock signal generator. Referring to FIG. 3, the spread-spectrum clock signal generator 100 includes a frequency detector 110 and a digital controlled oscillator 120 coupled together in a loop of feedback. An input signal with a first frequency f1 is loaded and received by the frequency detector 110 and a feedback signal with a second frequency f2 coming out of the clock signal generator 100 is reloaded in the frequency detector 110. The loop of feedback is a frequency locking loop for making the second frequency f2 of the feedback signal to track the first frequency f1 of the input signal.

In an embodiment, the digital controlled oscillator 120 is provided as a direct period synthesizer that is based on a base time unit Δ and controlled by a digital frequency control word F to select one of multiple (K) input pulses of an input frequency f in with equally spaced phase of A to form a synthesized periodic signal at its output port (which is then provided as the feedback signal). Based on a principle of time-average-frequency direct period synthesis, the frequency control word (or simply called control word) F is a number between 2 and 2K.

Figure 4:
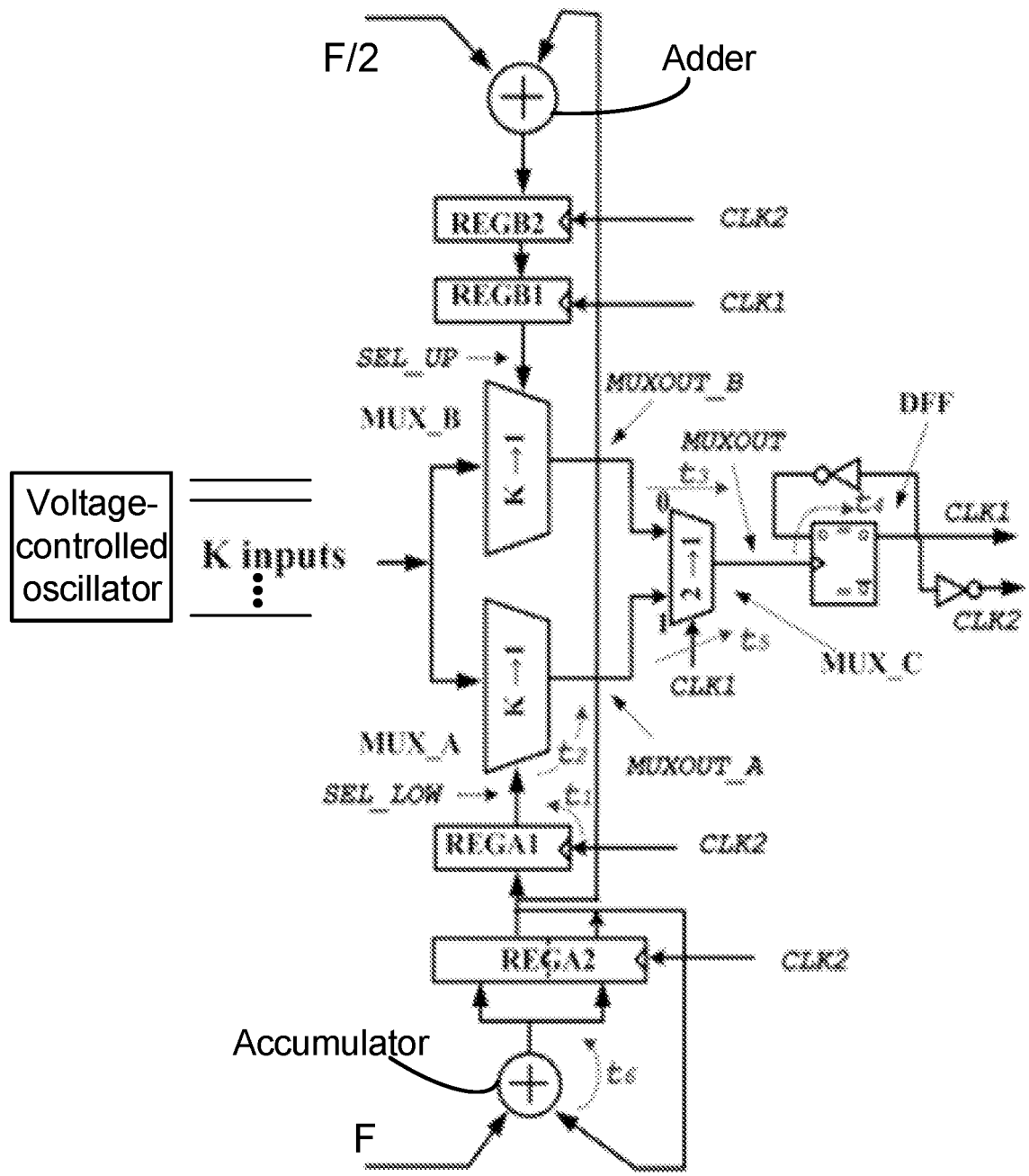
FIG. 4 is a functional diagram of a digital controlled oscillator according to an embodiment of the present disclosure.
Figure 5:
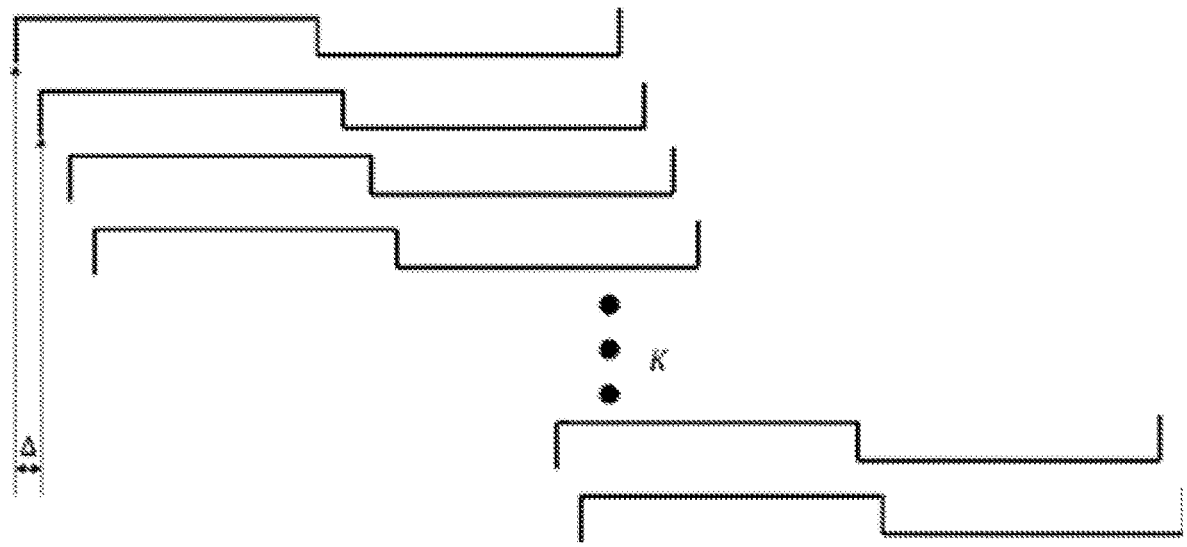
FIG. 5 is a schematic diagram of K input pulses for the digital controlled oscillator of FIG. 4 according to an embodiment of the present disclosure.

FIG. 4 shows a functional diagram of a digital controlled oscillator according to an embodiment of the present disclosure. Referring to FIG. 4, the K input pulses are generated by a simple voltage-controlled oscillator. Optionally, the K input pulses are based on the base time unit Δ which is created from K phase-evenly-spaced signals with a same frequency $f_{in}$. FIG. 5 shows a schematic diagram of K input pulses for the digital controlled oscillator of FIG. 4 according to an embodiment of the present disclosure. Optionally, the base time unit is achieved with a circuit including a ring of K-stage cross-NANDs. Optionally, the base time unit is also made from an inverter chain, a Johnson counter, or a delayed locked loop. The K input pulses are inputted respectively to two K-to-1 multiplexers. A first K-to-1 multiplexer (MUX_A) at a lower half of the figure is coupled to a 2-pipeline register controlled by the control word F via an accumulator to allow the K input pulses to pass through a lower path as a first output MUXOUT_A. At a transition time t6, the accumulator performs accumulation computation every rising edge of clock signal to handle that the control word F is a real number including a fraction part r beyond an integer part I. The K-to-1 multiplexer in the lower path dominates the length of logic '0' of output CLK1 at a low voltage level. At a first transition time t1, the SEL_LOW is fed into the first (or lower) K-to-1 multiplexer at a rising edge of CLK2. So, it will choose one pulse of the K pulses to be the first output. A second K-to-1 multiplexer (MUXB) is coupled to a 2-pipeline register controlled by the half control word F/2 via an adder to input the K pulses through an upper path for generating a high level of a second output MUXOUT_B. The adder only has the integer part of the control word F. The K-to-1 multiplexer in the upper path dominates the length of logic '1' of output CLK1 at a high voltage level. Additionally, a 2-to-1 multiplexer is controlled by CLK1 to control the transition of upper path and lower path. Now only one signal, from either upper path or lower path, arrives at a toggle flip-flop circuit which includes a D-type flip-flop DFF and two inverters to toggle the output MUXOUT at every rising edge of clock signal, from '1' to '0' or from '0' to '1'. At a second transition time t2, the chosen signal passes the first multiplexer MUX_A and is fed into the 2-to-1 multiplexer. At a third transition time t3, which occurs simultaneously with t2, when CLK2 is at the state of logic '1' after rising edge, the CLK1 is at the state of logic '0'. So, the 2-to-1 multiplexer chooses the second output MUXOUT_B from the upper path as MUXOUT sent to the toggle flip-flop. At a fourth transition time t4, the rising edge of the second output MUXOUT_B arrives at the toggle flip-flop which finishes the transition from 0 to 1. At a fifth transition time t5, CLK1 now is transited to 1. So the 2-to-1 multiplexer chooses the first output MUXOUT_A of the lower path to send to the toggle flip-flop. The whole process repeat itself.

From the base time unit Δ, the synthesizer associated with the digital controlled oscillator 120 first creates two (or more) types of cycles $T_A$ and $T_B$ that are alternately appeared one after another. Their length-in-times are given below, $$T_A = I \cdot \Delta, T_B = (I+1) \cdot \Delta$$

where I is an integer. For a certain first timeframe $t_A$, the cycle $T_A$ lasts to yield $N_A$ number of pulses, $t_A = N_A \cdot T_A$. For a certain first timeframe $t_B$, the cycle $T_B$ lasts to yield $N_B$ number of pulses, $t_B = N_B \cdot T_B$. When the digital controlled oscillator 120 is operating, it uses $T_A$ and $T_B$ in an interleaved fashion, yielding a time-average frequency (TAF) $f_{TAF}$ as a weighted average over $t_A + t_B$ for the synthesized periodic signal:

$$T_{TAF} = \frac{N_A \cdot T_A + N_B \cdot T_B}{N_A + N_B} = I \cdot \Delta + \frac{N_B}{N_A + N_B} \cdot \Delta$$

-continued $$T_{TAF} = \frac{1}{f_{TAF}} = (1-r) \cdot T_A + r \cdot T_B = (I+r) \cdot \Delta = F \cdot \Delta$$

where $F = U + r$, $r = \frac{N_B}{N_A + N_B}$, representing the probability of occurrence of $T_A$ and $T_B$ during the synthesis of the time-average pulse $T = T_{TAF}$. By changing the control word F, the output frequency $f_{out} = f_{TAF}$ can be changed.

In the embodiment, the control word F is controlled or selected by the frequency detector 110 in the loop of feedback with a frequency lock mechanism. Referring to FIG. 3, the first frequency f1 of the input signal for the loop of feedback is the same as the input frequency $f_{in}$ of the K input pulses for the digital controlled oscillator 120 and the second frequency f2 of the feedback signal is dynamically selected from one time-average frequency $f_{TAF}$ outputted from the digital controlled oscillator 120. The frequency detector 110 includes a fraction controller 112 configured to compare the input signal of the first frequency f1 with the feedback signal of the second frequency f2 to generate a first control signal fast and a second control signal slow alternately for determining an integer part I of the control word F in the loop of feedback to enable a tracking of the second frequency f2 to the first frequency f1.

Figure 6:
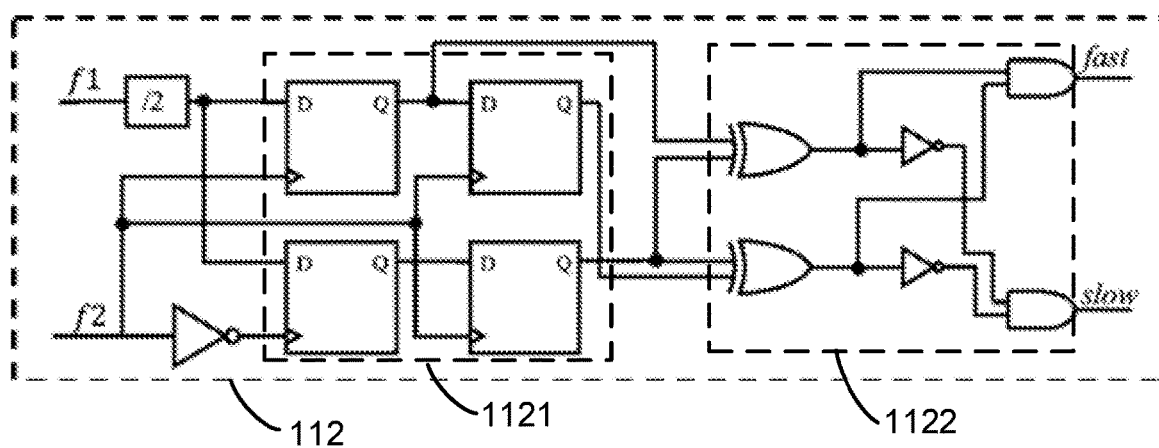
FIG. 6 is a functional diagram of a fraction controller according to an embodiment of the present disclosure.

In particular, FIG. 6 shows a functional diagram of a fraction controller according to an embodiment of the present disclosure. Referring to FIG. 6, the fraction controller 112 includes a first input port receiving the input signal, and a second input port receiving the feedback signal. Additionally, the fraction controller 112 includes a trigger sub-circuit 1121 coupled to the first input port and the second input port and configured to detect a relationship between the first frequency f1 and the second frequency f2. The fraction controller 112 further includes a combined logic sub-circuit 1122 coupled to the trigger sub-circuit 1121 to generate the first control signal fast to a first control port in a first timeframe $t_A$ and the second control signal slow to a second control port in a second timeframe $t_B$. The first timeframe $t_A$ and second timeframe $t_B$ alternately appearing one after other.

Figure 7:
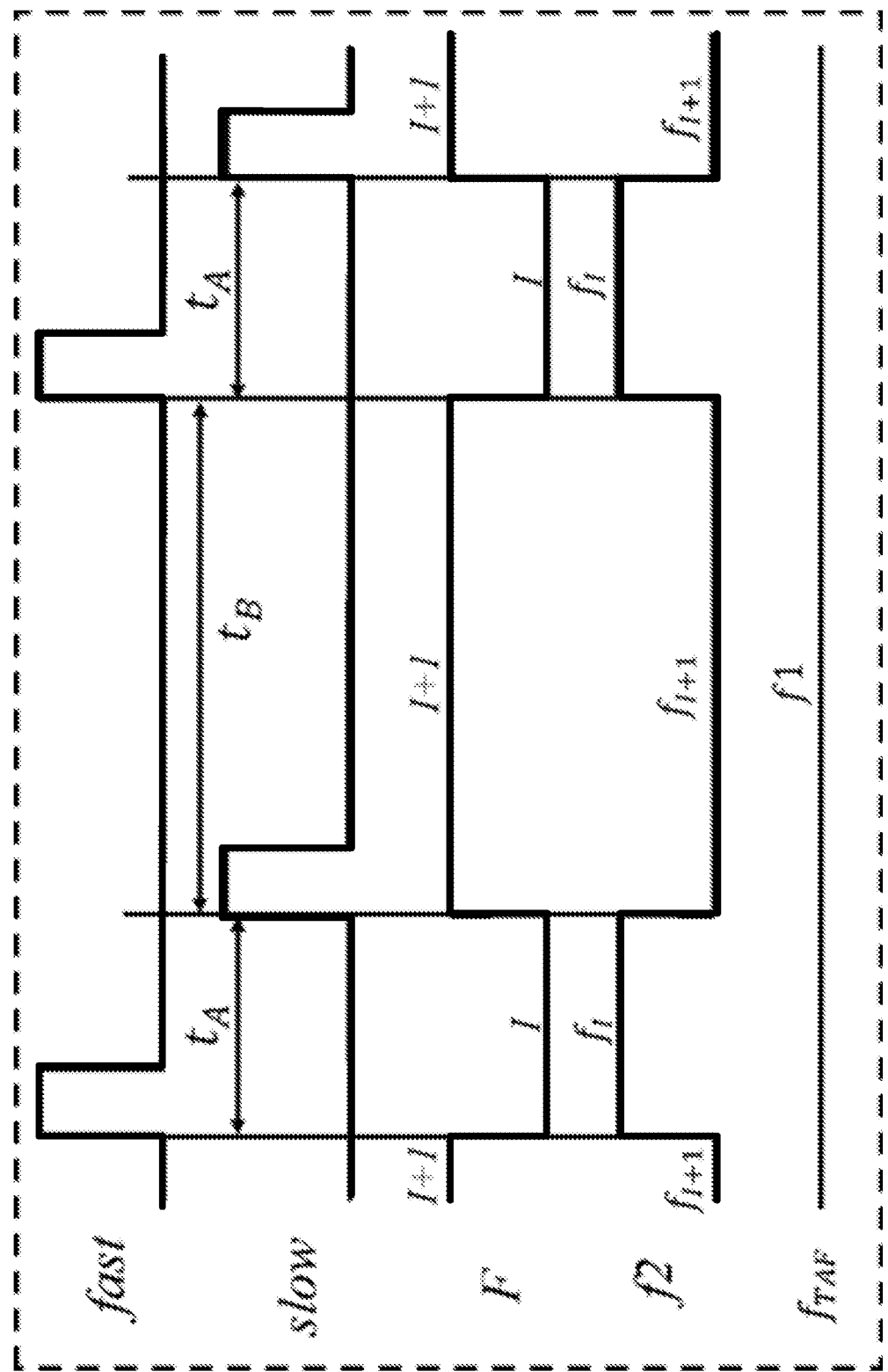
FIG. 7 is a timing waveform diagram of control signals generated in the fraction controller according to an embodiment of the present disclosure.

In an embodiment, the trigger sub-circuit 1121 includes four D-type flip-flops coupled to the first input port via a power-divider and to the second input port partially via an inverter. The trigger sub-circuit 1121 is configured to determine the first frequency f1 being greater/smaller than the second frequency f2. The combined logic sub-circuit 1122 includes two XOR gates, two inverters, and two AND gates configured to output either the first control signal fast to the first control port in the first timeframe $t_A$ based on determination that the first frequency f1 is greater than the second frequency f2 or the second control signal slow to the second control port in the second timeframe $t_B$ based on determination that the first frequency f1 is smaller than the second frequency f2. In the embodiment, the first control signal fast is driving to shrink the control word F and the second control signal slow is driving to enlarge the control word F, in the loop of feedback. Eventually, the whole loop of feedback reaches a dynamic equilibrium as the first control signal fast and the second control signal slow are alternately generated and the control word F is switched between two integers I and I+1, as shown schematically in FIG. 7. In other words, the second frequency is substantially locked to the first frequency through a relationship of $$f_{out} = \frac{K \cdot f_{in}}{F}$$

within the loop of feedback. When input frequency changes, i.e., the locking target is changed, the fraction controller 112 is operated to select different integer I, and different ratio of $N_A$ and $N_B$ to determine the frequency locking. The fraction controller 112 achieves a substantial real-time frequency locking in the loop of feedback.

The frequency detector 110 also includes a phase-shift controller 114 configured to generate a spread-spectrum signal by providing n register levels for the first control signal fast and the second control signal slow generated by the fraction controller 112. In an embodiment, the phase-shift controller 114 introduces n phase delays to each of the first control signal fast and the second control signal slow for providing extra multiple options to the fraction part r of the control word F. The phase-shift controller 114 then randomly select one optional value of the fraction part r to finally determine the control word F=I+r in the loop of feedback.

Figure 8:
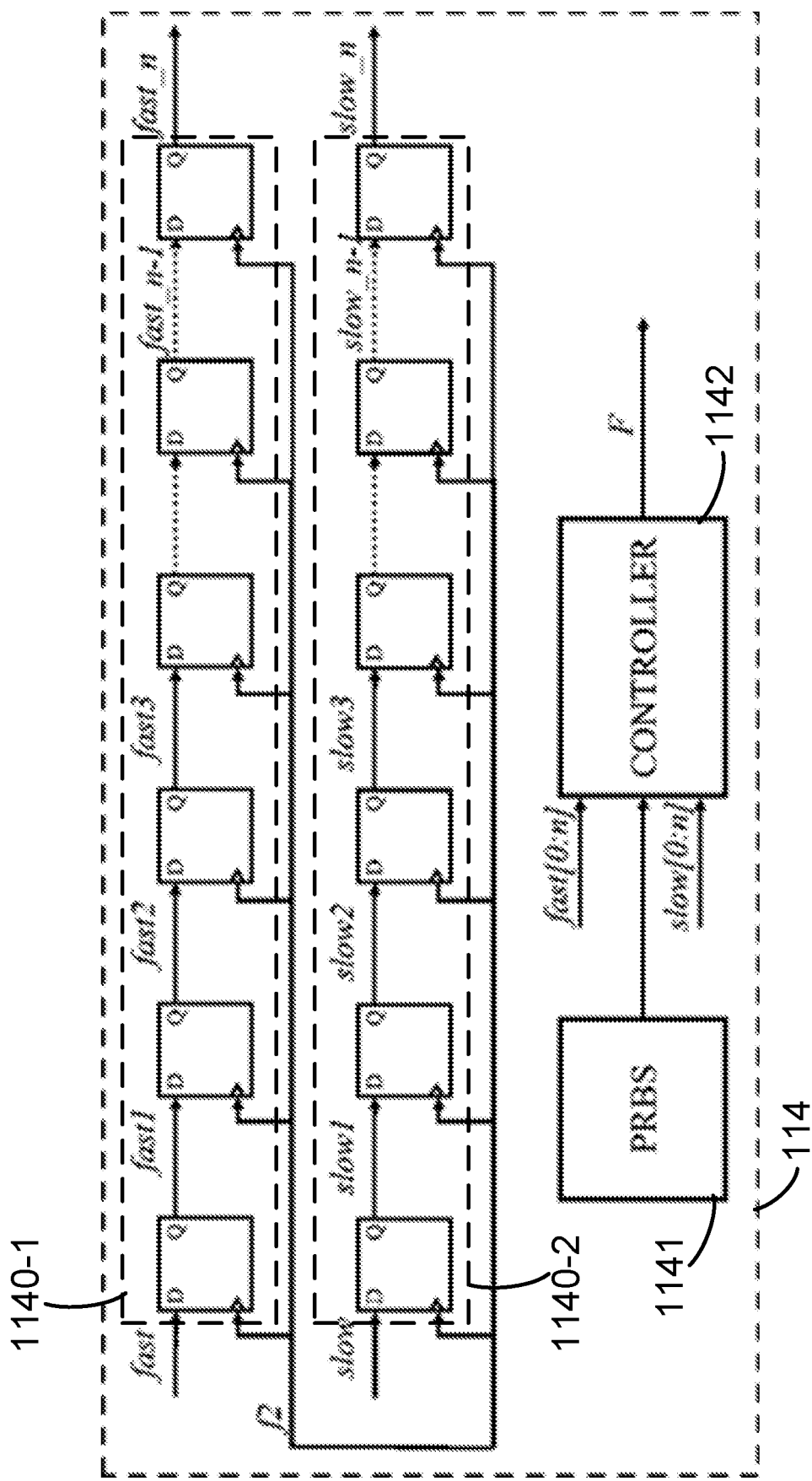
FIG. 8 is a functional diagram of a phase-shift controller according to an embodiment of the present disclosure.

In an embodiment, FIG. 8 is a functional diagram of a phase-shift controller according to an embodiment of the present disclosure. Referring to FIG. 8, the phase-shift controller 114 includes an n-level cache sub-circuit configured to receive the first control signal fast to generate total n levels of first register-delayed control signals, or receive the second control signal slow to generate total n levels of second register-delayed control signals. Optionally, the n-level cache sub-circuit includes a first group of D-type flip-flops 1140-1 having n stages connected in series configured to receive the first control signal fast at a first stage of the n stages of the first group of D-type flip-flops 1140-1 and to receive the feedback signal f2 at each of the n stages of the first group of D-type flip-flops 1140-1, to generate the n levels of first register-delayed control signals. For example, it outputs fast1 in a first stage, fast2 in a second stage, fast3 in a third stage, . . . , fastn−1 in a (n−1)-th stage, and fastn in a n-th stage. Each of the first n stages can be one path selected randomly to give a register-delayed control signal with a respectively phase delay. Also, the n-level cache sub-circuit includes a second group of D-type flip-flops 1140-2 having n stages connected in series configured to receive the second control signal slow at the first stage of the n stages of the second group of D-type flip-flops 1140-2 and to receive the feedback signal f2 at each of the n stages of the second group of D-type flip-flops 1140-2, to generate the n levels of second register-delayed control signals, i.e., slow1 in a first stage, slow2 in a second stage, slow3 in a third stage, . . . , slown−1 in a (n−1)-th stage, and slown in a n-th stage. Each of the second n stages can be one path selected randomly to give a register-delayed control signal with a respectively phase delay. Additionally, the first control signal fast and the n levels of first register-delayed control signals, denoted in general as fast[0:n], and the second control signal slow and the n levels of second register-delayed control signals, denoted in general as slow [0:n] are fed into a controller 1142.

The phase-shift controller 114 also includes a pseudo random binary sequence (PRBS) generator 1141 to randomly select a fraction number to drive the controller 1142 to select any specific path associated with the n levels of the first register-delayed control signals and the n levels of the second register-delayed control signals. Effectively, the n-level cache sub-circuit introduces n choices of $N_A$ number of pulses with a cycle period of $T_A$ and n choices of $N_B$ number of pulses with a cycle period of $T_B$. Therefore, the fraction number $r=N_B/(N_A+N_B)$ of the control word F is selected by the phase-shift controller 114. The extra phase delay via the fraction number r for the control word F spreads the frequency spectrum.

Figure 9:
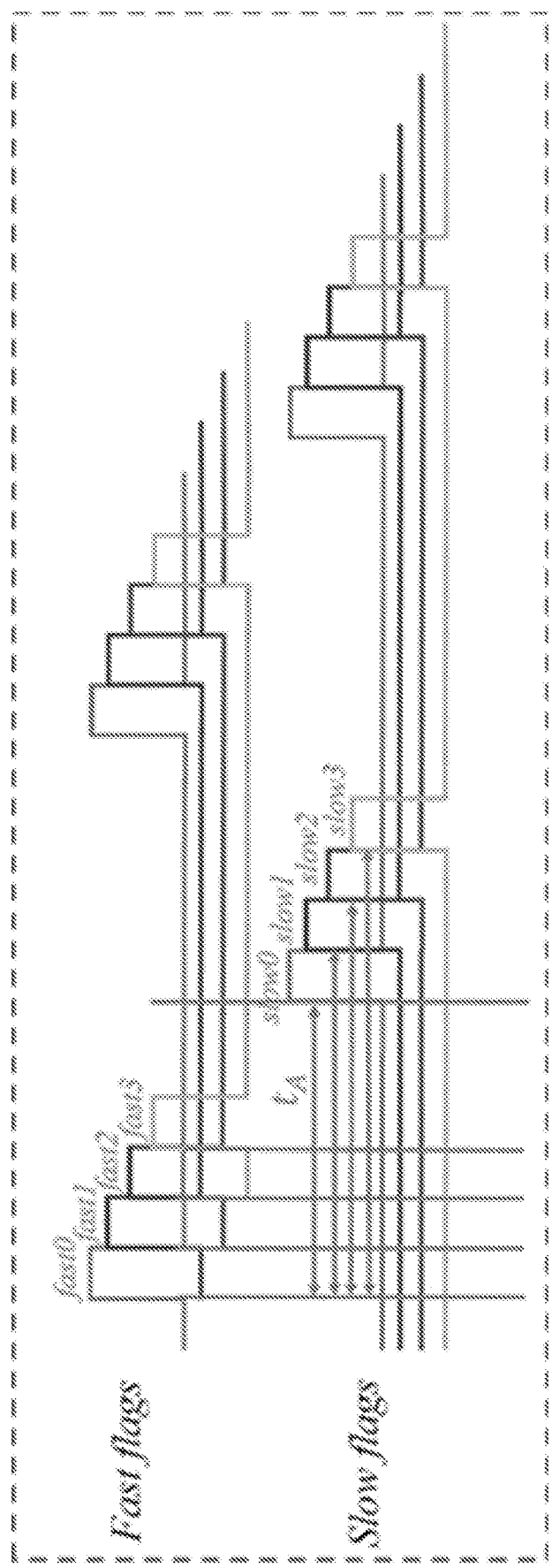
FIG. 9 is an exemplary diagram showing four possible options of a first cycle period under a 4-level cache registration delay according to an embodiment of the present disclosure.

For example, FIG. 9 shows an exemplary diagram showing four possible options of a first cycle period under a 4-level cache registration delays according to an embodiment of the present disclosure. Every cache registration corresponds to an addition of a delay line to cause a phase offset θ between input and output. Such as, $$\theta_A = T - T_A$$

$$\theta_B = T_B - T$$

Referring to FIG. 9, to has four optional values, i.e., contains four different numbers, $N_A$, $N_A+1$, $N_A+2$, $N_A+3$, of pules with period $T_A$ upon four options of selections among fast0, fast1, fast2, fast3 in the first 4-level register-delayed control signals or four options of selections among slow0, slow1, slow2, and slow3 in the second 4-level register-delayed control signals. In this case, $N_A$ and $N_B$ can be selected from four optional values respectively, $$N_A \in \{N_A, N_A+1, N_A+2, N_A+3\}; N_B \in \{N_B, N_B+1, N_B+2, N_B+3\}$$

Therefore, different combination of $N_A$ and $N_B$ can cause changes in the fraction number r. In this example of 4-level cache registration structure, the fraction number r can have 4×4=16 different optional values. The phase-shift controller 114 uses a PRBS generator 1141 to randomly select a value of fraction r for the 4-level cache sub-circuit to determine respective paths for the register-delayed control signals. The randomness of the selection of fraction r increases randomness of the output frequency, achieving a spectrum spreading or broadening.

Figure 10:
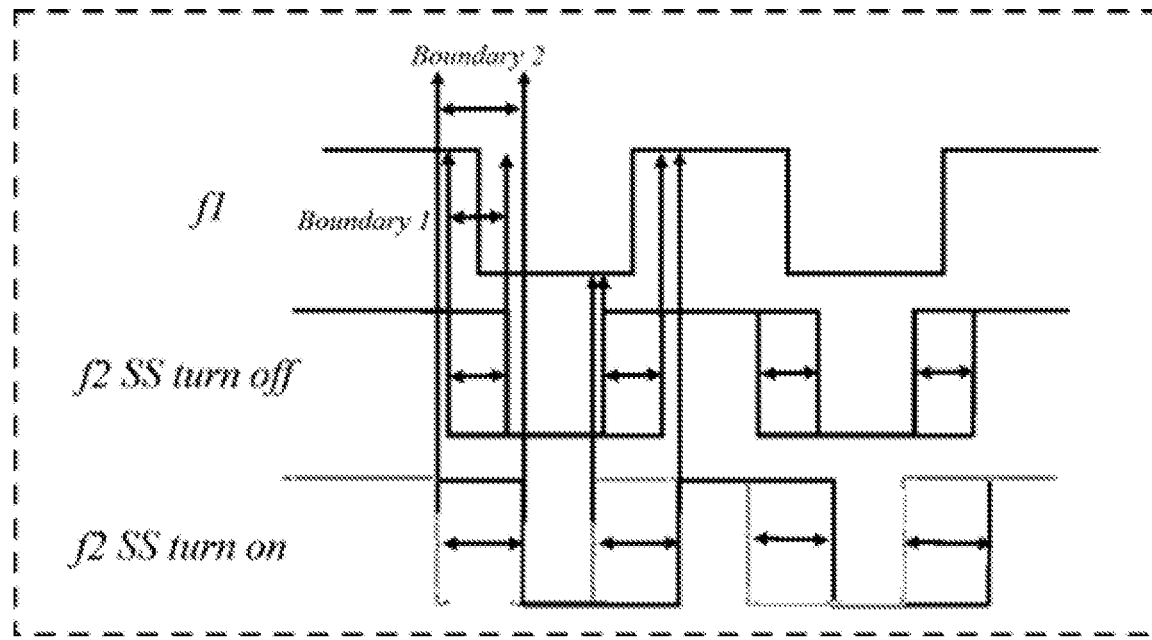
FIG. 10 is a schematic diagram showing a comparison of broadened boundaries in output signals with and without a spread-spectrum function being turned on according to an embodiment of the present disclosure.

In particular, before using the phase-shift controller 114 for broadening the spectrum, with the control word F being switched back and forth between only integer value I and I+1 for substantially locking the output frequency of the synthesized periodic signal to the input frequency, a moderate frequency broadening has occurred as a Boundary 1 in FIG. 10 around the input frequency. When the phase-shift controller 114 is introduced to randomly select a value of the fraction part r of the control word F, the spectrum is spread even larger with a broadened frequency boundary. In an embodiment, a maximum phase shift value $\theta_{max}^-$ of the feedback signal leading the input signal in phase is equal to $N_A \cdot (T-T_A)$ and a maximum phase shift value $\theta_{max}^+$ of the feedback signal lagging behind the input signal in phase is equal to $N_B(T_B-T)$. Referring to FIG. 10, a more broadened boundary, Boundary 2, is provided to the output signal when the phase-shift controller 114 is included in the frequency detector 110. Because $N_A$ and $N_B$ have wider value ranges, the maximum phase shift values for the second frequency f2 leading or lagging the first frequency f1 become larger, resulting a more broadened boundary for the second frequency that substantially tracks the first frequency. In general, with a combined contribution of both the fraction controller 112 and the phase-shift controller 114, the frequency detector 110 achieves frequency locking or tracking function and spectrum spreading function for the synthesized periodic signal by determining both the integer part and fraction part of the control word F=I+r in the loop of feedback (see FIG. 3).

Figure 11:
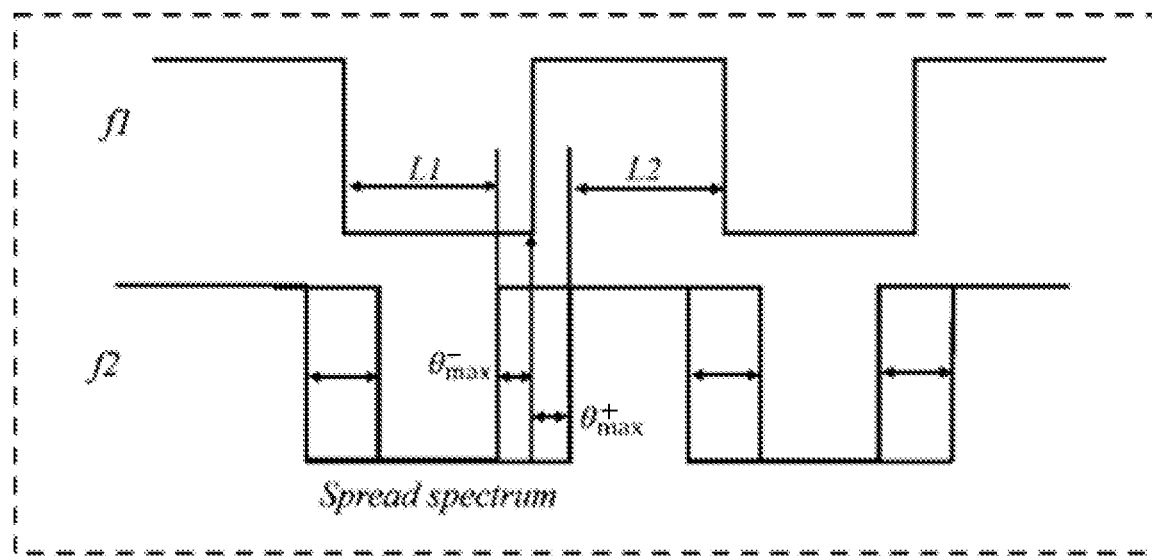
FIG. 11 is a schematic diagram showing a spread-spectrum synchronous clock signal for driving secured data transmission according to an embodiment of the present disclosure.

In an embodiment, the synthesized periodic signal with the time-average frequency that is substantially locked to the input frequency around a broadened boundary in frequency spectrum can be outputted as a synchronous clock signal. This clock signal can be used to drive synchronized data transmission at the receiver without worrying about data reception reliability and data transmission security. The broadened boundary of the spread-spectrum clock signal help to reduce radiated energy by spreading the power to wider range of frequencies. At the same time, it can be made to satisfy the following conditions for successful synchronous data transmission. FIG. 11 shows a schematic diagram of a spread-spectrum synchronous clock signal for driving secured data transmission according to an embodiment of the present disclosure. Referring to FIG. 11, an input signal has a first frequency f1 and an output signal generated by the synchronous clock signal generator circuit described herein (FIG. 3 through FIG. 10) has a second frequency f2 corresponding to a period of T. The second frequency f2 substantially tracks the first frequency f1, yet with a broadened boundary. Referring to FIG. 9, the broadened boundary has a maximum value of $\theta_{max}^- + \theta_{max}^+$. Provided with the maximum boundary value, FIG. 11 yields, $$L1 = \frac{T}{2} - \theta_{max}^-,$$

$$L2 = \frac{T}{2} - \theta_{max}^+.$$

L1 is a time period counting from a falling edge of the first frequency to an earliest rising edge of the second frequency and L2 is a time period counting from a latest rising edge of the second frequency to the falling edge of the first frequency. If the time-length of time period L1 is set to be longer than a data-establishing time for the receiver to receive the data and the time-length of time period L2 is set to be longer than a data-maintaining time for the receiver to receive the data, this synchronous clock signal can be securely used to drive data transmission.

In another aspect, the present disclosure provides a chip for functionally generating spread-spectrum synchronous clock signal. The chip includes a circuit described herein and is implemented in Field Programmable Gate Arrays (FPGA). Alternatively, the chip can also be implemented in an application-specific integrated circuit (ASIC). The chip has a full digital circuitry structure made by a few cache registers and composite logic circuits with advantages in high efficiency, simple design, small volume to achieve real-time spectrum spreading for synthesizing clock signals. It suppresses electromagnetic interference radiated energy while maintaining system performance and data transmission security, applicable in many integrate circuit designs.

In another aspect, the present disclosure provides a method for generating spread-spectrum synchronous clock signals comprising comparing an input signal of a first frequency with a feedback signal of a second frequency in a loop of feedback; generating a first control signal and a second control signal; determining an integer part I of a control word F to track the first frequency; registering n levels for the first control signal and the second control signal to introduce n phase delays for randomly changing a fraction part r (0<r<1) of the control word F to provide a broadened boundary in frequency spectrum; and generating a synthesized periodic signal with the second frequency based on a base time unit Δ, the first frequency, and the control word F, the synthesized periodic signal being fed back as the feedback signal in the loop of feedback and outputted with the second frequency being locked within the broadened boundary of the first frequency.

Optionally, the method further comprises generating K pulses of the first frequency with equally spaced phase shift of Δ, so that under control of the control word F (2≤F≤2K) the synthesized periodic signal is selected from one of the K pulses with an average period T=F·Δ and the second frequency, the second frequency being a time-average frequency equal to K/F multiplying the first frequency.

Optionally, the method further comprises detecting a relationship between the first frequency and the second frequency; and generating a first control signal and a second control signal alternately in a first timeframe and a second timeframe one after another based on the relationship between the first frequency and the second frequency.

Optionally, the method further comprises determine whether the first frequency is greater or smaller than the second frequency; and outputting either the first control signal in the first timeframe based on determination that the first frequency is greater than the second frequency or the second control signal in the second timeframe based on determination that the first frequency is smaller than the second frequency.

Optionally, the first control signal is to control reducing the control word F in the first timeframe and the second control signal is to control increasing the control word F in the second timeframe, so that the control word F is switched between I and I+1 as the loop of feedback reaches a dynamic equilibrium with one first timeframe and one second timeframe appearing alternately one after another.

Optionally, the dynamic equilibrium comprises one first timeframe and one second timeframe appearing alternately one after another on average, based on a number $N_A$ of output pulses having a first period $T_A=I·Δ$ in the first timeframe and a number $N_B$ of output pulses having a second period $T_B=(I+1)·Δ$ in the second timeframe, yielding a fraction number r to be a ratio of $N_B$ over a sum of $N_A$ and $N_B$.

Optionally, the method further comprises receiving the first control signal to generate total n levels of first register-delayed control signals, or receiving the second control signal to generate total n levels of second register-delayed control signals; randomly select a value of the fraction number r; selecting any path associated with the n levels of the first register-delayed control signals and the n levels of the second register-delayed control signals; and receiving the value of the fraction number r to determine the control word F.

Optionally, the method further comprises forming a first group of D-type flip-flops having n stages connected in series to receive the first control signal at the first one of the n stages of the first group of D-type flip-flops and to receive the feedback signal at each of the n stages of the first group of D-type flip-flops; generating n levels of first register-delayed control signals; forming a second group of D-type flip-flops having n stages connected in series to receive the second control signal at the first one of the n stages of the second group of D-type flip-flops and to receive the feedback signal at each of the n stages of the second group of D-type flip-flops; and generating n levels of second register-delayed control signals.

Optionally, the method further comprises introducing n choices of $N_A$ and n choices of $N_B$, and a randomly selected $r=N_B/(N_A+N_B)$ to provide the broadened boundary defined by a maximum value of the feedback signal leading the input signal in phase as $N_A \cdot (T-T_A)$ and a maximum value of the feedback signal lagging behind the input signal in phase as $N_B \cdot (T_B-T)$.

Optionally, the method further comprises using a first K-to-1 multiplexer coupled to an accumulation-register controlled by the control word F via an accumulator in a first path to input K pulses of the first frequency with equally spaced phase delay Δ, generating a low level of the synthesized periodic signal, using a second K-to-1 multiplexer coupled to an adder-register controlled by the half control word F/2 via an adder in a second path to input the K pulses of the first frequency with equally spaced phase delay Δ, generating a high level of the synthesized periodic signal, using a 2-to-1 multiplexer to interlock the first path and the second path to output either the high level or the low level of the synthesized periodic signal.

Optionally, the method further comprises transmitting the synthesized periodic signal as a spread-spectrum clock signal as the second frequency is substantially synchronous to the first frequency under a condition that a data-reception establishing time is less than half the period T minus a maximum value of the synthesized periodic signal leading the input signal in phase and a data-reception maintaining time is less than half the period T minus a maximum value of the synthesized periodic signal lagging behind the input signal in phase.

Optionally, the method further comprises toggling transition of a upper path and a lower path.

Optionally, the method further comprises generating multiple pulses of the first frequency with equally spaced phase delay Δ; obtaining a synthesized periodic signal with a time-average frequency from one of the multiple pulses controlled by a control word F, the synthesized periodic signal being used as a feedback signal; comparing the input signal of the first frequency with the feedback signal of a second frequency in a loop of feedback; and generating a first control signal and a second control signal alternately in a first timeframe and a second timeframe one after another based on relationship between the first frequency and the second frequency.

Optionally, the method further comprises updating an integer part I of the control word F based on the first control signal or the second control signal to allow the second frequency to track the first frequency.

Optionally, updating an integer part I of the control word F comprises reducing the integer part I triggered by the first control signal in the first timeframe and increasing the integer part I triggered by the second control signal in the second timeframe.

Optionally, the method further comprises generating multiple delays in respective first control signal and the second control signal.

Optionally, the method further comprises selecting a fraction number r of the control word F randomly based on the multiple delays to provide a broadened phase boundary of a spread spectrum.

Optionally, selecting a fraction number r of the control word F randomly based on the multiple delays comprises selecting randomly one of first register-delayed control signals using a pseudo random binary sequence (PRBS) generator to drive a controller to control a number of output pulses with a first period in the first timeframe, and selecting randomly one of second register-delayed control signals using a pseudo random binary sequence (PRBS) generator to drive the controller to control a number of output pulses with a second period in the second timeframe.

Optionally, the method further comprises outputting a clock signal based on the synthesized periodic signal with the time-average frequency being locked by the control word F within I and I+1 at a dynamic equilibrium in the loop of feedback.

In yet another aspect, the present disclosure provides a method for generating spread-spectrum synchronous clock signals. In an embodiment, the method can be executed based on the circuit described herein, shown in FIG. 3 through FIG. 11. In particular, the method includes providing an input signal of a first frequency and generating multiple pulses of the first frequency with equally spaced phase delay Δ. The method further includes obtaining a synthesized periodic signal with a time-average frequency from one of the multiple pulses controlled by a control word F. The synthesized periodic signal is used as a feedback signal. Additionally, the method includes comparing the input signal of the first frequency with the feedback signal of a second frequency in a loop of feedback. The method also includes generating a first control signal and a second control signal alternately in a first timeframe and a second timeframe one after another based on relationship between the first frequency and the second frequency. The method further includes updating an integer part I of the control word F based on the first control signal or the second control signal to allow the second frequency to track the first frequency. Furthermore, the method includes generating multiple delays in respective first control signal and the second control signal. The method further includes selecting a fraction part r of the control word F randomly based on the multiple delays to provide a broadened phase boundary of a spread spectrum. Moreover, the method includes outputting a clock signal based on the synthesized periodic signal with the time-average frequency being locked by the control word F within I and I+1 at a dynamic equilibrium in the loop of feedback.

In some embodiments, the step of obtaining a synthesized periodic signal with a time-average frequency includes using a first K-to-1 multiplexer coupled to an accumulation-register controlled by the control word F via an accumulator in a first path to input K pulses of the first frequency with equally spaced phase delay Δ, generating a low level of the synthesized periodic signal, using a second K-to-1 multiplexer coupled to an adder-register controlled by the half control word F/2 via an adder in a second path to input the K pulses of the first frequency with equally spaced phase delay Δ, generating a high level of the synthesized periodic signal, and using a 2-to-1 multiplexer to interlock the first path and the second path to output either the high level or the low level of the synthesized periodic signal.

In some embodiments, the step of generating a first control signal and a second control signal includes operating a fraction controller to output the first control signal in a first timeframe based on determination that the first frequency is greater than the second frequency and output the second control signal in a second timeframe based on determination that the first frequency is smaller than the second frequency.

In some embodiments, the step of updating an integer part I of the control word F includes reducing the integer part I triggered by the first control signal in the first timeframe and increasing the integer part I triggered by the second control signal in the second timeframe.

In some embodiments, the step of generating multiple delays in respective first control signal and the second control signal includes forming a first group of D-type flip-flops having n stages connected in series to receive the first control signal at the first one of the n stages of the first group of D-type flip-flops and to receive the feedback signal at each of the n stages of the first group of D-type flip-flops, generating n levels of first register-delayed control signals; forming a second group of D-type flip-flops having n stages connected in series to receive the second control signal at the first one of the n stages of the second group of D-type flip-flops and to receive the feedback signal at each of the n stages of the second group of D-type flip-flops, and generating n levels of second register-delayed control signals.

In some embodiments, the step of selecting a fraction part r of the control word F randomly based on the multiple delays further includes selecting randomly one of the first register-delayed control signals using a pseudo random binary sequence (PRBS) generator to drive a controller to control a number of output pulses with a first period in the first timeframe, and selecting randomly one of the second register-delayed control signals using a pseudo random binary sequence (PRBS) generator to drive the controller to control a number of output pulses with a second period in the second timeframe.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for generating spread-spectrum synchronous clock signals comprising:
    comparing an input signal of a first frequency with a feedback signal of a second frequency in a loop of feedback;
    generating a first control signal and a second control signal;
    determining an integer part I of a control word F to track the first frequency;
    registering n levels for the first control signal and the second control signal to introduce n phase delays for randomly changing a fraction part r (0<r<1) of the control word F to provide a broadened boundary in frequency spectrum; and
    generating a synthesized periodic signal with the second frequency based on a base time unit $\Delta$, the first frequency, and the control word F, the synthesized periodic signal being fed back as the feedback signal in the loop of feedback and outputted with the second frequency being locked within the broadened boundary of the first frequency.

2. The method of claim 1, further comprising generating K pulses of the first frequency with equally spaced phase shift of $\Delta$, so that under control of the control word F ($2 \leq F \leq 2K$) the synthesized periodic signal is selected from one of the K pulses with an average period $T = F \cdot \Delta$ and the second frequency, the second frequency being a time-average frequency equal to K/F multiplying the first frequency.

3. The method of claim 1, further comprising:
    detecting a relationship between the first frequency and the second frequency; and
    generating a first control signal and a second control signal alternately in a first timeframe and a second timeframe one after another based on the relationship between the first frequency and the second frequency.

4. The method of claim 3, further comprising:
    determine whether the first frequency is greater or smaller than the second frequency; and
    outputting either the first control signal in the first timeframe based on determination that the first frequency is greater than the second frequency or the second control signal in the second timeframe based on determination that the first frequency is smaller than the second frequency.

5. The method of claim 4, wherein the first control signal is to control reducing the control word F in the first timeframe and the second control signal is to control increasing the control word F in the second timeframe, so that the control word F is switched between I and I+1 as the loop of feedback reaches a dynamic equilibrium with one first timeframe and one second timeframe appearing alternately one after another.

6. The method of claim 5, wherein the dynamic equilibrium comprises one first timeframe and one second timeframe appearing alternately one after another on average, based on a number $N_A$ of output pulses having a first period $T_A = I \cdot \Delta$ in the first timeframe and a number $N_B$ of output pulses having a second period $T_B = (I+1) \cdot \Delta$ in the second timeframe, yielding a fraction number r to be a ratio of $N_B$ over a sum of $N_A$ and $N_B$.

7. The method of claim 6, further comprising:
    receiving the first control signal to generate total n levels of first register-delayed control signals, or receiving the second control signal to generate total n levels of second register-delayed control signals;
    randomly select a value of the fraction number r;
    selecting any path associated with the n levels of the first register-delayed control signals and the n levels of the second register-delayed control signals; and
    receiving the value of the fraction number r to determine the control word F.

8. The method of claim 7, further comprising:
    forming a first group of D-type flip-flops having n stages connected in series to receive the first control signal at the first one of the n stages of the first group of D-type flip-flops and to receive the feedback signal at each of the n stages of the first group of D-type flip-flops;

generating n levels of first register-delayed control signals;

forming a second group of D-type flip-flops having n stages connected in series to receive the second control signal at the first one of the n stages of the second group of D-type flip-flops and to receive the feedback signal at each of the n stages of the second group of D-type flip-flops; and generating n levels of second register-delayed control signals.

9. The method of claim 8, further comprising introducing n choices of $N_A$ and n choices of $N_B$, and a randomly selected $r=N_B/(N_A+N_B)$ to provide the broadened boundary defined by a maximum value of the feedback signal leading the input signal in phase as $N_A \cdot (T-T_A)$ and a maximum value of the feedback signal lagging behind the input signal in phase as $N_B \cdot (T_B-T)$.

10. The method of claim 2, further comprising using a first K-to-1 multiplexer coupled to an accumulation-register controlled by the control word F via an accumulator in a first path to input K pulses of the first frequency with equally spaced phase delay $\Delta$, generating a low level of the synthesized periodic signal, using a second K-to-1 multiplexer coupled to an adder-register controlled by the half control word F/2 via an adder in a second path to input the K pulses of the first frequency with equally spaced phase delay $\Delta$, generating a high level of the synthesized periodic signal, using a 2-to-1 multiplexer to interlock the first path and the second path to output either the high level or the low level of the synthesized periodic signal.

11. The method of claim 10, further comprising transmitting the synthesized periodic signal as a spread-spectrum clock signal as the second frequency is substantially synchronous to the first frequency under a condition that a data-reception establishing time is less than half the period T minus a maximum value of the synthesized periodic signal leading the input signal in phase and a data-reception maintaining time is less than half the period T minus a maximum value of the synthesized periodic signal lagging behind the input signal in phase.

12. The method of claim 10, further comprising toggling transition of a upper path and a lower path.

13. The method of claim 1, further comprising:

generating multiple pulses of the first frequency with equally spaced phase delay $\Delta$;

obtaining a synthesized periodic signal with a time-average frequency from one of the multiple pulses controlled by a control word F, the synthesized periodic signal being used as a feedback signal;

comparing the input signal of the first frequency with the feedback signal of a second frequency in a loop of feedback; and generating a first control signal and a second control signal alternately in a first timeframe and a second timeframe one after another based on relationship between the first frequency and the second frequency.

14. The method of claim 13, further comprising updating an integer part I of the control word F based on the first control signal or the second control signal to allow the second frequency to track the first frequency.

15. The method of claim 14, wherein updating an integer part I of the control word F comprises reducing the integer part I triggered by the first control signal in the first timeframe and increasing the integer part I triggered by the second control signal in the second timeframe.

16. The method of claim 13, further comprising generating multiple delays in respective first control signal and the second control signal.

17. The method of claim 13, further comprising selecting a fraction number r of the control word F randomly based on the multiple delays to provide a broadened phase boundary of a spread spectrum.

18. The method of claim 17, wherein selecting a fraction number r of the control word F randomly based on the multiple delays comprises selecting randomly one of first register-delayed control signals using a pseudo random binary sequence (PRBS) generator to drive a controller to control a number of output pulses with a first period in the first timeframe, and selecting randomly one of second register-delayed control signals using a pseudo random binary sequence (PRBS) generator to drive the controller to control a number of output pulses with a second period in the second timeframe.

19. The method of claim 13, further comprising outputting a clock signal based on the synthesized periodic signal with the time-average frequency being locked by the control word F within I and I+1 at a dynamic equilibrium in the loop of feedback.

\* \* \* \* \*